United States Patent
Lim et al.

(10) Patent No.: US 8,334,207 B2
(45) Date of Patent: Dec. 18, 2012

(54) METHOD FOR FABRICATING SEMICONDUCTOR DEVICE WITH BURIED GATES

(75) Inventors: Ji-Min Lim, Gyeonggi-do (KR); Kyung-ho Hwang, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 535 days.

(21) Appl. No.: 12/649,559

(22) Filed: Dec. 30, 2009

(65) Prior Publication Data

US 2011/0086503 A1 Apr. 14, 2011

(30) Foreign Application Priority Data

Oct. 9, 2009 (KR) .................. 10-2009-0096019

(51) Int. Cl.
*H01L 21/44* (2006.01)
(52) U.S. Cl. ....................... 438/672; 438/669
(58) Field of Classification Search .................. 438/669, 438/672
See application file for complete search history.

(56) References Cited

U.S. PATENT DOCUMENTS 7,034,408 B1 * 4/2006 Schloesser .................... 257/213
7,696,076 B2 * 4/2010 Jung et al. .................... 438/593

FOREIGN PATENT DOCUMENTS

| KR | 100511045 | 8/2005 |
|---|---|---|
| KR | 100714900 | 5/2007 |
| KR | 100819559 | 4/2008 |
| KR | 1020080098177 | 11/2008 |
| KR | 1020110003220 | 1/2011 |

OTHER PUBLICATIONS

Notice of Allowance issued by the Korean Intellectual Property Office on Dec. 28, 2011.

* cited by examiner

*Primary Examiner* — Bradley K Smith (74) *Attorney, Agent, or Firm* — IP & T Group LLP (57) ABSTRACT

A method for fabricating a semiconductor device includes providing a substrate including cell regions and peripheral regions; selectively forming a gate conductive layer over the substrate in the peripheral regions, forming a sealing layer over the substrate with the gate conductive layer formed thereon, forming an insulation layer over the sealing layer to cover the substrate with the gate conductive layer formed on the substrate, planarizing the insulation layer to expose the sealing layer formed over the gate conductive layer, and forming a plurality of plugs in the cell regions, the plurality of the plugs penetrating the insulation layer and the sealing layer.

23 Claims, 11 Drawing Sheets

METHOD FOR FABRICATING SEMICONDUCTOR DEVICE WITH BURIED GATES

CROSS-REFERENCE TO RELATED APPLICATIONS

The present application claims priority of Korean Patent Application No. 10-2009-0096019, filed on Oct. 9, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device employing buried gates (BG).

As semiconductor devices become miniaturized, achieving diverse device characteristics and performing appropriate processes have been gradually more difficult. Particularly, in achieving under 40 nm process technologies, physical limitations in terms of gate structure, bit line structure, and contact structure are being met. While a structure with such physical dimensions can be formed, it has been difficult to acquire satisfactory device characteristics, such as resistance, refresh, low failure, and breakdown voltage. In light of such a concern, a buried gate (BG) process in which gates are buried in active regions has been developed. The buried gate process decreases parasitic capacitance, increases process margins, and forms miniaturized cell transistors.

FIGS. 1A to 1E are cross-sectional views illustrating a conventional method for fabricating a semiconductor device employing buried gates. FIGS. 2A to 2D are pictures illustrating a concern raised in a conventional semiconductor device employing buried gates.

Figure 1A:
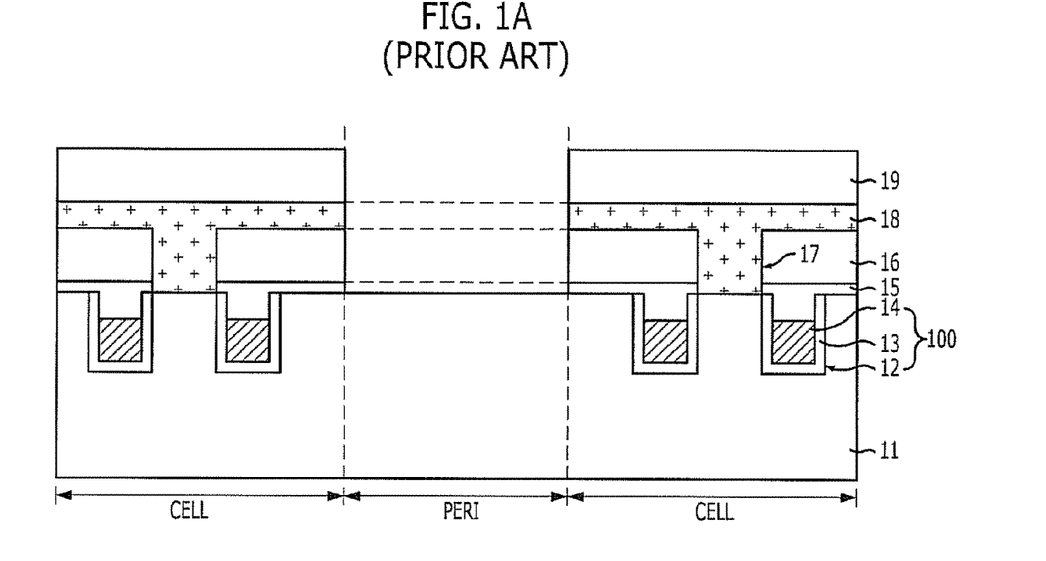
FIGS. 1A to 1E are cross-sectional views illustrating a conventional method for fabricating a semiconductor device employing buried gates.

Referring to FIG. 1A, a sealing layer 15 and an insulation layer 16 are sequentially formed over a substrate 11 including cell regions CELL, each cell region having a plurality of buried gates 100, and peripheral regions PERI. Herein, each of the buried gates 100 formed in the cell regions includes trenches 12, a cell gate insulation layer 13 formed on the surface of the trenches 12, and a cell gate electrode 14 filling a portion of the trench 12 over the cell gate insulation layer 13. The sealing layer 15 covers the profile of the substrate 11 while filling the other portion of the trench 12.

Subsequently, a bit line contact hole 17 is formed to expose the substrate 11 between the buried gates 100 by selectively etching the insulation layer 16 and the sealing layer 15 in each cell region. Then, a plug conductive layer 18 is deposited over the substrate 11 to fill the bit line contact hole 17.

Subsequently, a first photoresist pattern 19 is formed over the plug conductive layer 18 by using a peripheral open mask, and the plug conductive layer 18, the insulation layer 16, and the sealing layer 15 are sequentially etched using the first photoresist pattern 19 as an etch barrier, to thereby expose the substrate 11 in each peripheral region.

Figure 1B:
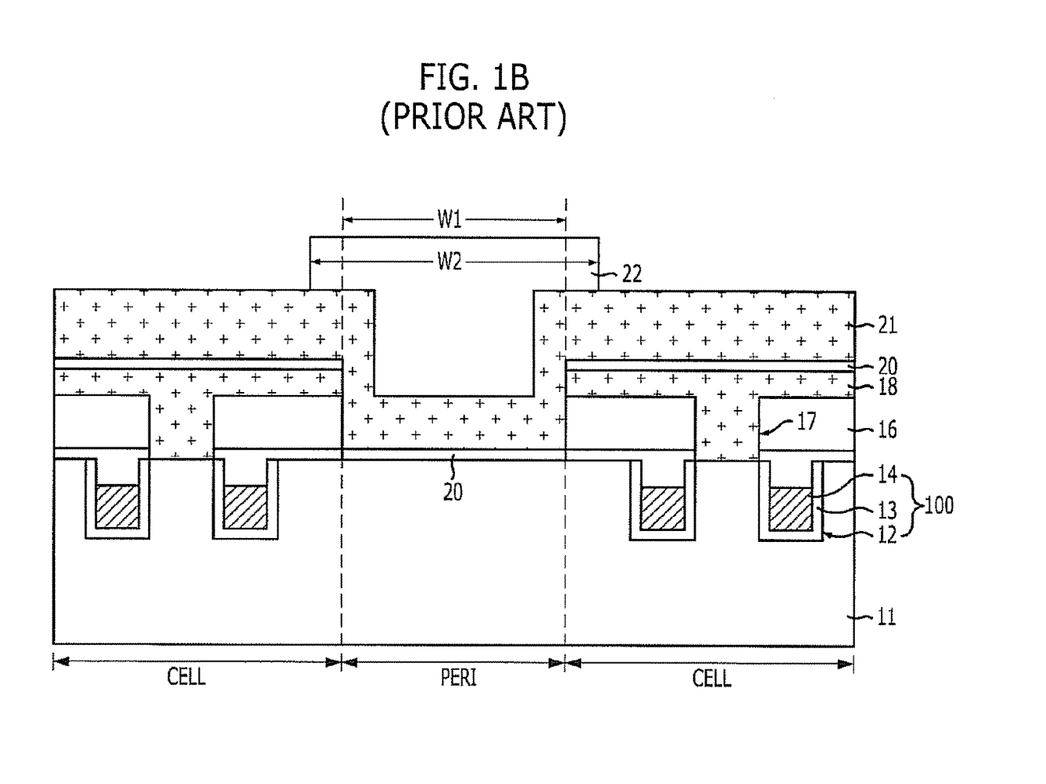

Referring to FIG. 1B, after the first photoresist pattern 19 is removed, a peripheral gate insulation layer 20 and a peripheral gate conductive layer 21 are sequentially formed over the substrate 11.

Subsequently, a second photoresist pattern 22 is formed over the peripheral gate conductive layer 21 by using a cell open mask. Herein, the linewidth W2 of the second photoresist pattern 22 is longer than the line width W1 of a predetermined peripheral region. This is to protect a structure formed at the boundary between the cell region and the peripheral region from being damaged by misalignment in a subsequent process.

Figure 1C:
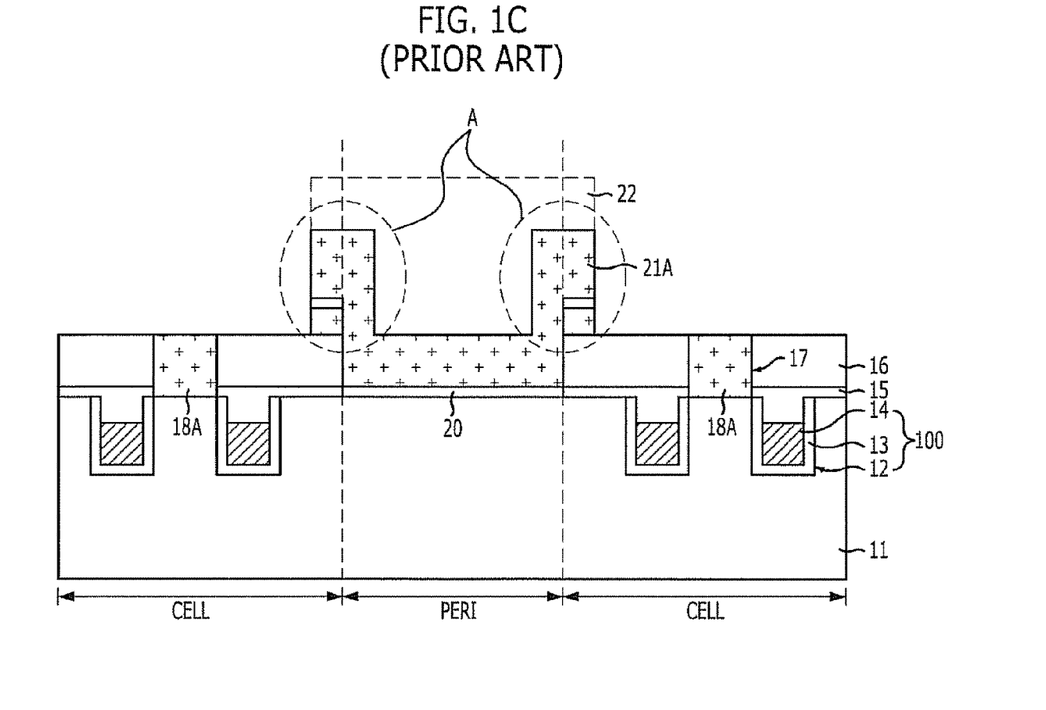

Referring to FIG. 1C, a bit line contact plug 18A is formed by using the second photoresist pattern 22 as an etch barrier and sequentially etching the peripheral gate conductive layer 21, the peripheral gate insulation layer 20, and the plug conductive layer 18 in the cell region. After the formation of the bit line contact plug 18A, the second photoresist pattern 22 is removed. Hereafter, the etched peripheral gate conductive layer 21 is denoted with a reference numeral '21A' and referred to as a peripheral gate conductive layer pattern 21A.

Herein, the step height between the cell region and the peripheral region and the second photoresist pattern 22 formed to have a longer linewidth W2 than the predetermined linewidth W1 of the peripheral region forms a protrusion A formed at the boundary between the cell region and the peripheral region after the etch process.

Figure 1D:
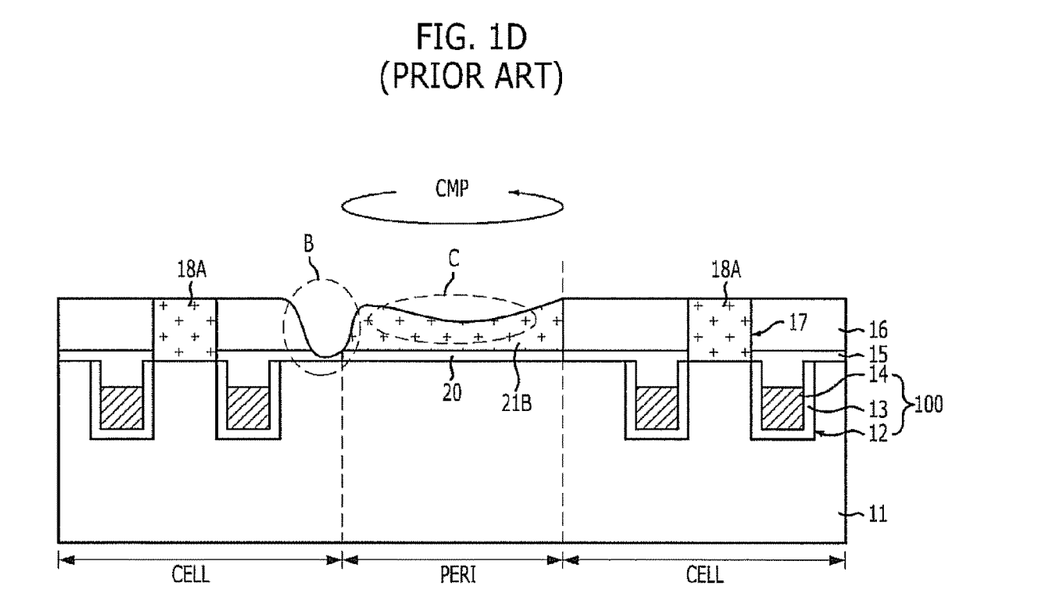

Referring to FIG. 1D, a planarization process is performed to remove the protrusion A formed at the boundary between the cell region and the peripheral region after the etch process. The planarization process may be performed using chemical mechanical polishing (CMP). Hereafter, the peripheral gate conductive layer pattern 21A with the protrusion A removed is denoted with a reference numeral '21B' and referred to as "a protrusion-free peripheral gate conductive layer pattern 21B."

Figure 1E:
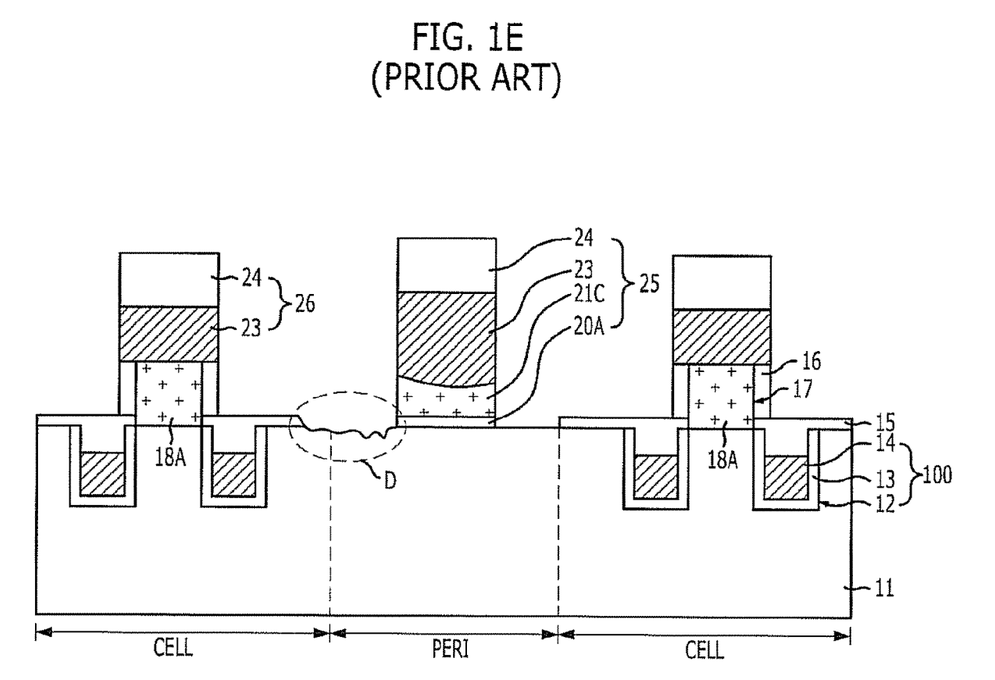

Referring to FIG. 1E, a conductive layer 23 and a hard mask layer 24 are sequentially formed over the substrate 11. The hard mask layer 24, the conductive layer 23 and the insulation layer 16 in the cell region are sequentially etched to thereby form a bit line 26 contacting the bit line contact plug 18A, while the hard mask layer 24, the conductive layer 23, the protrusion-free peripheral gate conductive layer pattern 21B, and the peripheral gate insulation layer 20 in the peripheral region are sequentially etched to thereby form a peripheral gate 25. Hereafter, the etched protrusion-free peripheral gate conductive layer pattern 21B and the etched peripheral gate insulation layer 20 are denoted with reference numerals '21C' and '20A' and referred to as re-etched protrusion-free peripheral gate conductive layer pattern 21C and the peripheral gate insulation layer pattern 20A, respectively.

However, since the conventional technology forms the re-etched protrusion-free peripheral gate conductive layer pattern 21C after the formation of the plug conductive layer 18, it requires an etch process performed using a peripheral open mask to secure a space for forming the re-etched protrusion-free peripheral gate conductive layer pattern 21C and an etch process performed using a cell open mask to form the bit line contact plug 18A. Therefore, the conventional technology is relatively complicated and raises a concern in that the protrusion A is formed at the boundary between the cell region and the peripheral region.

Figure 2A:
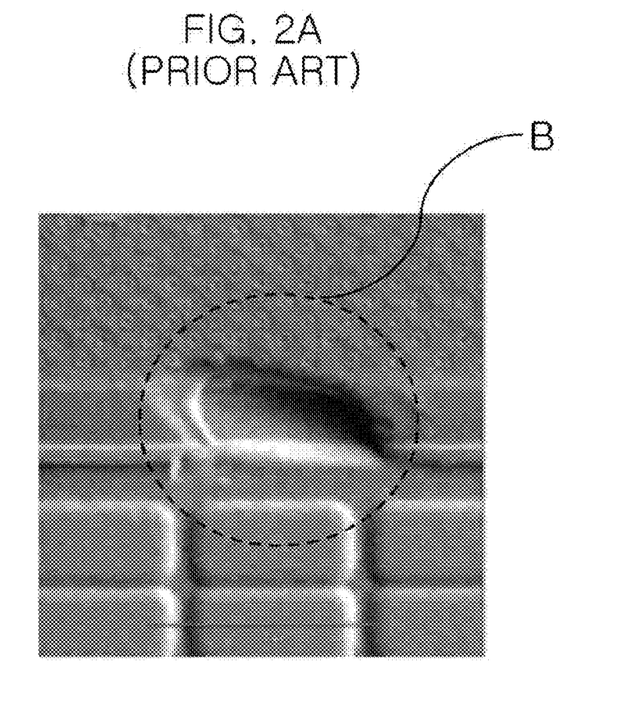
FIGS. 2A to 2D are pictures illustrating a concern raised in a conventional semiconductor device employing buried gates.
Figure 2B:
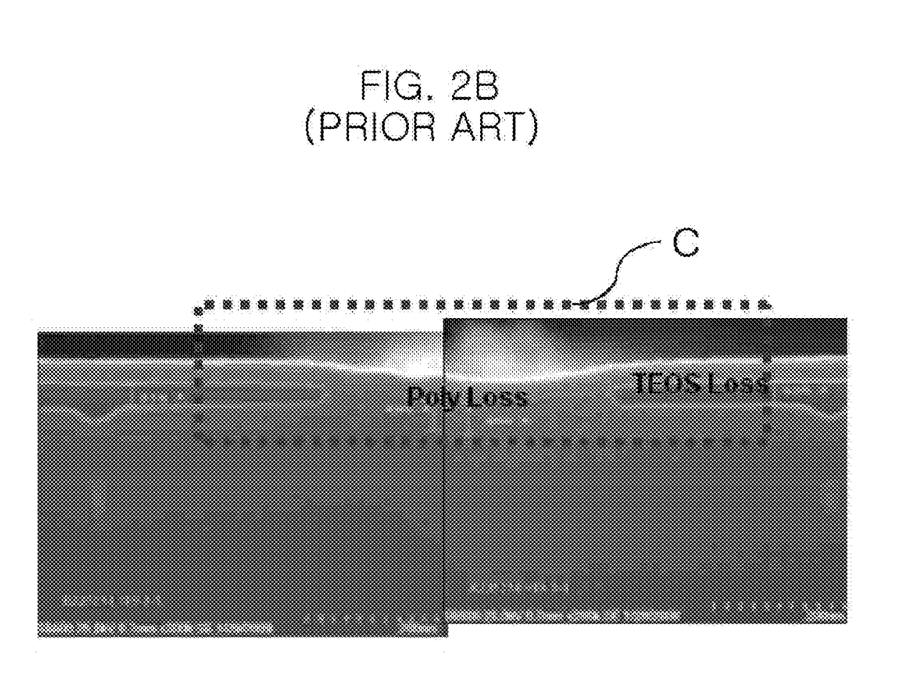
Figure 2C:
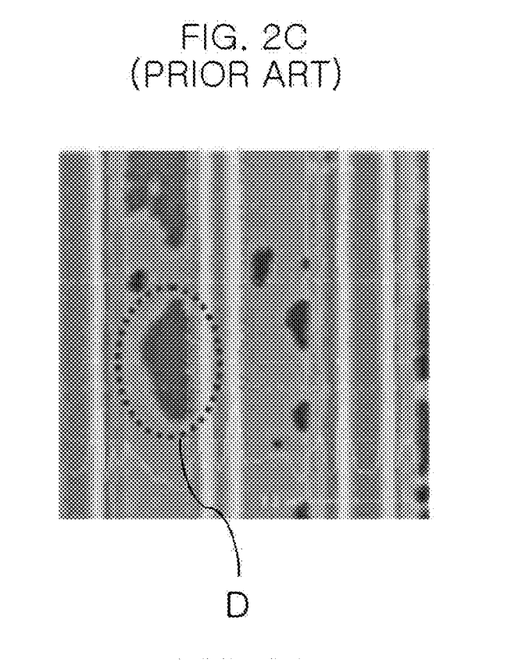
Figure 2D:
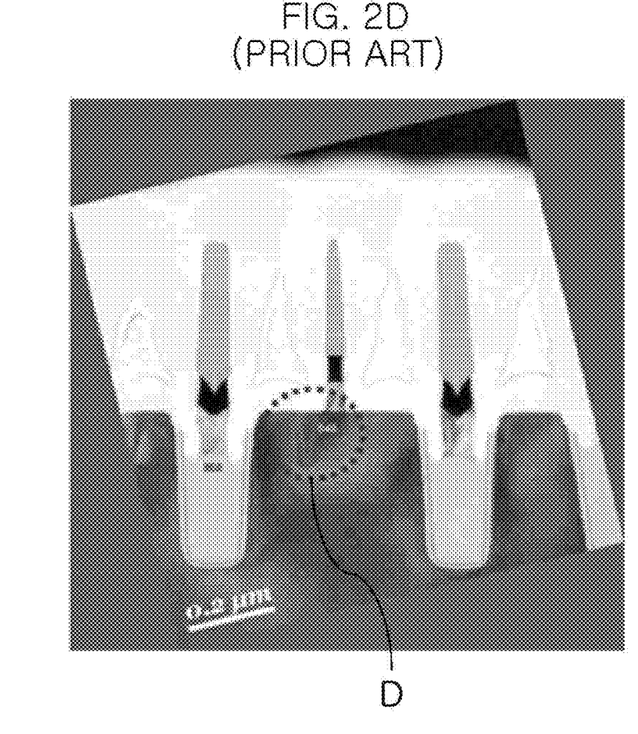

Also, there is a concern in that a structure pre-formed in the cell region and the peripheral region are damaged during the planarization process which is performed to remove the protrusion A formed at the boundary between the cell region and the peripheral region. More specifically, the structure formed under the protrusion A may be dug out (see reference symbol 'B' in FIGS. 1D and 2) or the protrusion-free peripheral gate conductive layer pattern 21B in the peripheral region may be lost (see reference symbol 'C' in FIGS. 1D and 2B) as the protrusion A is removed during the planarization process. In FIGS. 2B, "poly" represents the peripheral gate conductive layer and "TEOS" represents the insulation layer.

As described above, the defects occurring during the planarization process performed to remove the protrusion A also raises a concern such as loss of the substrate 11 (see reference symbol 'D' in FIGS. 1E, 2C and 2D) during a subsequent process for forming the peripheral gate 25, thus deteriorating the characteristics and reliability of a semiconductor device.

SUMMARY OF THE INVENTION

An embodiment of the present invention is directed to a semiconductor device fabrication method that can prevent deteriorations in the characteristics and reliability of a semiconductor device employing buried gates, which originate from protrusions formed at the boundary between cell regions and peripheral regions in the semiconductor device.

In accordance with an embodiment of the present invention, a method for fabricating a semiconductor device includes: providing a substrate including cell regions and peripheral regions; selectively forming a gate conductive layer over the substrate in the peripheral regions; forming a sealing layer over the substrate with the gate conductive layer formed thereon; forming an insulation layer over the sealing layer to cover the substrate with the gate conductive layer formed on the substrate; planarizing the insulation layer to expose the sealing layer formed over the gate conductive layer; and forming a plurality of plugs in the cell regions, the plurality of the plugs penetrating the insulation layer and the sealing layer.

In accordance with another embodiment of the present invention, a method for fabricating a semiconductor device includes: providing a substrate including cell regions and peripheral regions; forming a gate conductive layer over the substrate; etching the gate conductive layer by using a cell open mask; forming a sealing layer over the substrate with the gate conductive layer formed thereon; forming an insulation layer over the sealing layer to cover the substrate with the gate conductive layer formed on the substrate; planarizing the insulation layer to expose the sealing layer formed over the gate conductive layer; forming a plurality of plugs in the cell regions, the plurality of the plugs penetrating the insulation layer and the sealing layer; selectively removing the sealing layer formed over the gate conductive layer; and forming peripheral gates by patterning the gate conductive layer.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention to be described hereafter provide a semiconductor device fabrication method that can prevent/reduce deteriorations in the characteristics and reliability of a semiconductor device employing buried gats (BG), which originate from protrusions formed at the boundary between cell regions and peripheral regions by forming a plug conductive layer in the cell regions and forming a peripheral gate conductive layer in the peripheral regions in the semiconductor device. To this end, the embodiments of the present invention prevent/reduce from the source the formation of protrusions at the boundary between the cell regions and the peripheral regions by forming a peripheral gate conductive layer in the peripheral regions before a plug conductive layer is formed in the cell regions.

Figure 3A:
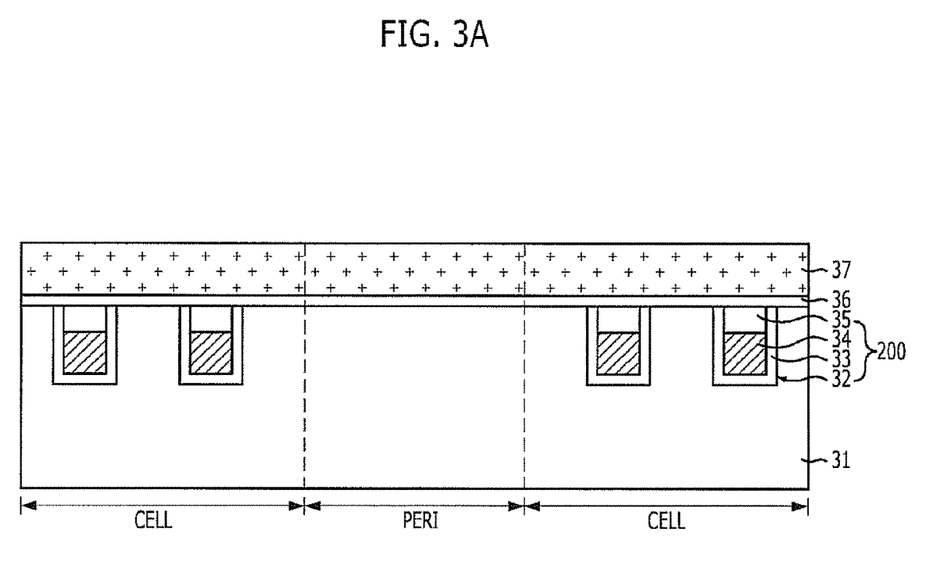
FIGS. 3A to 3D are cross-sectional views illustrating a method for fabricating a semiconductor device employing buried gates in accordance with a first embodiment of the present invention.

FIGS. 3A to 3H are cross-sectional views illustrating a method for fabricating a semiconductor device employing buried gates in accordance with a first embodiment of the present invention. Referring to FIG. 3A, a hard mask pattern (not shown) is formed over a substrate 31 having cell regions CELL and peripheral regions PERI, and a plurality of trenches 32 are formed by etching the substrate 31 in the cell regions by using the hard mask pattern as an etch barrier. Subsequently, a cell gate insulation layer 33 is formed on the surface of the trenches 32, and a cell gate electrode 34 filling a portion of each trench 32 is formed over the cell gate insulation layer 33. Herein, the cell gate insulation layer 33 may be formed of an oxide layer, e.g., a silicon oxide ($SiO_2$) layer, and the cell gate electrode 34 may be formed of a metal layer, e.g., a tungsten (W) layer, a titanium nitride (TiN) layer, and a tantalum nitride (TaN) layer.

Subsequently, after the hard mask pattern is removed, a protective layer 35 filling the rest portion of each trench 32 is formed over the cell gate electrode 34. Herein, the protective layer 35 protects the cell gate electrode 34 during a subsequent process and it may be formed of a nitride layer.

Through the above processes, buried gates 200 each including the plurality of the trenches 32 formed over the substrate 31, the cell gate insulation layer 33 formed on the surface of the trenches 32, the cell gate electrode 34 formed over the cell gate insulation layer 33 to fill a portion of each trench 32, and the protective layer 35 filling the rest portion of the trench 32 are formed.

Subsequently, a peripheral gate insulation layer 36 and a peripheral gate conductive layer 37 are sequentially formed over the substrate 31 including cell regions where the plurality of the buried gates 200 are formed and peripheral regions. Herein, the peripheral gate insulation layer 36 may be formed of an oxide layer, e.g., a silicon oxide layer, and the peripheral gate conductive layer 37 may be formed of a silicon layer, e.g., a polysilicon layer.

Figure 3B:
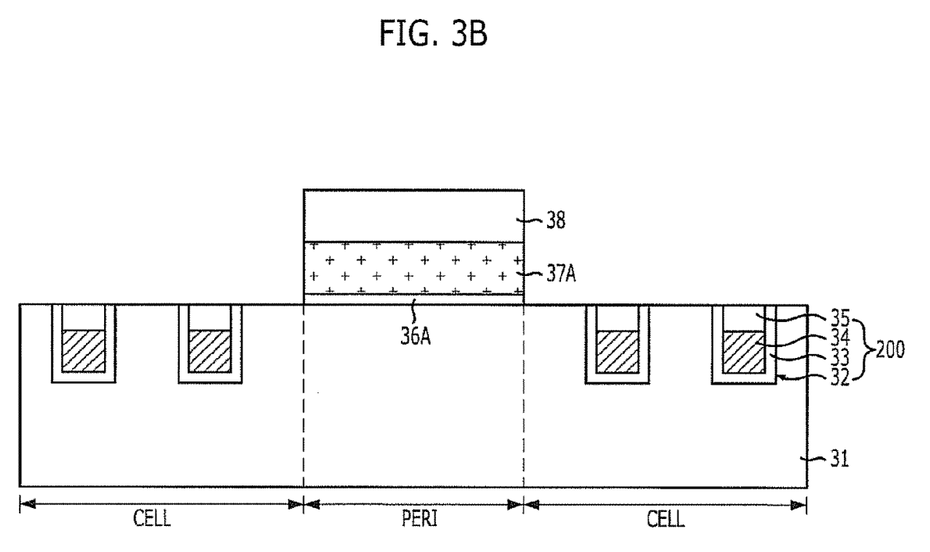

Referring to FIG. 3B, a photoresist pattern 38 is formed over the peripheral gate conductive layer 37 by using a cell open mask, and the peripheral gate conductive layer 37 and the peripheral gate insulation layer 36 are sequentially etched by using the photoresist pattern 38 as an etch barrier so that the peripheral gate insulation layer 36 and the peripheral gate conductive layer 37 remains in the peripheral regions only. Hereafter, the etched peripheral gate insulation layer 36 and the etched peripheral gate conductive layer 37 are denoted with reference numerals '36A' and '37A' and referred to as "a peripheral gate insulation layer pattern 36A" and "the peripheral gate conductive layer pattern 37A."

Herein, the cell regions formed by the cell open mask used to leave the peripheral gate insulation layer pattern 36A and the peripheral gate conductive layer pattern 37A in the peripheral regions only are predetermined cell regions. The linewidth of the photoresist pattern 38 is the same as the predetermined linewidth of the peripheral regions. This is because there is no structure formed at the boundary between the cell regions and the peripheral regions before the formation of the photoresist pattern 38 as the peripheral gate conductive layer pattern 37A is formed in the peripheral regions before the plug conductive layer is formed in the cell regions. Therefore, the linewidth of the photoresist pattern 38 is the same as the predetermined linewidth of the peripheral regions. Even if an error, such as misalignment, occurs during the formation of the photoresist pattern 38, it is possible to prevent a pre-formed structure from being damaged during the process of etching the peripheral gate conductive layer pattern 37A and the peripheral gate insulation layer pattern 36A. When an exposure process for forming the photoresist pattern 38 is performed using a cell open mask, the linewidth of the photoresist pattern 38 may be controlled by adjusting the energy of exposed light and the distance between the cell open mask and a photoresist layer.

Figure 3C:
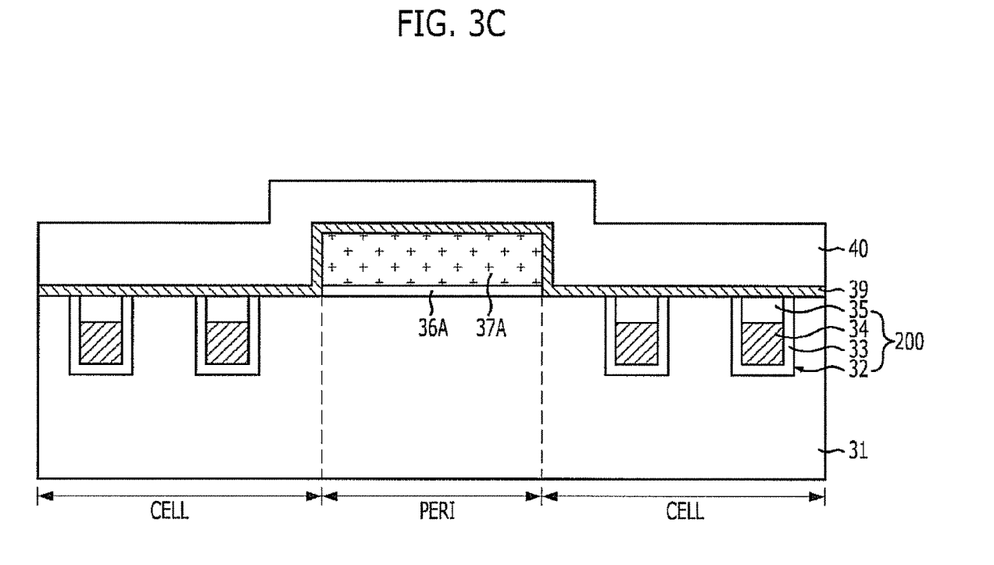

Referring to FIG. 3C, the photoresist pattern 38 is removed and a sealing layer 39 and an insulation layer 40 are sequentially formed over the substrate 31. The sealing layer 39 may be formed to have a uniform thickness along the surface of the resultant structure including the peripheral gate conductive layer pattern 37A, and the insulation layer 40 may be formed over the sealing layer 39 to cover the resultant structure including the peripheral gate conductive layer pattern 37A.

The sealing layer 39 functions as a protective layer for protecting the substrate 31 in the cell regions during a subsequent process, that is, a protective layer for protecting the buried gates 200 as well as protecting the peripheral gate conductive layer pattern 37A from being damaged (or lost). Therefore, the sealing layer 39 may be formed of a material having a selectivity (e.g., etch selectivity or polishing selectivity) with respect to the substrate 31 and the peripheral gate conductive layer pattern 37A. For example, the sealing layer 39 may be formed of a nitride layer.

The insulation layer 40 may be formed of a material having a selectivity with respect to the sealing layer 39. For example, when the sealing layer 39 is formed of a nitride layer, the insulation layer 40 may be formed of an oxide layer.

Figure 3D:
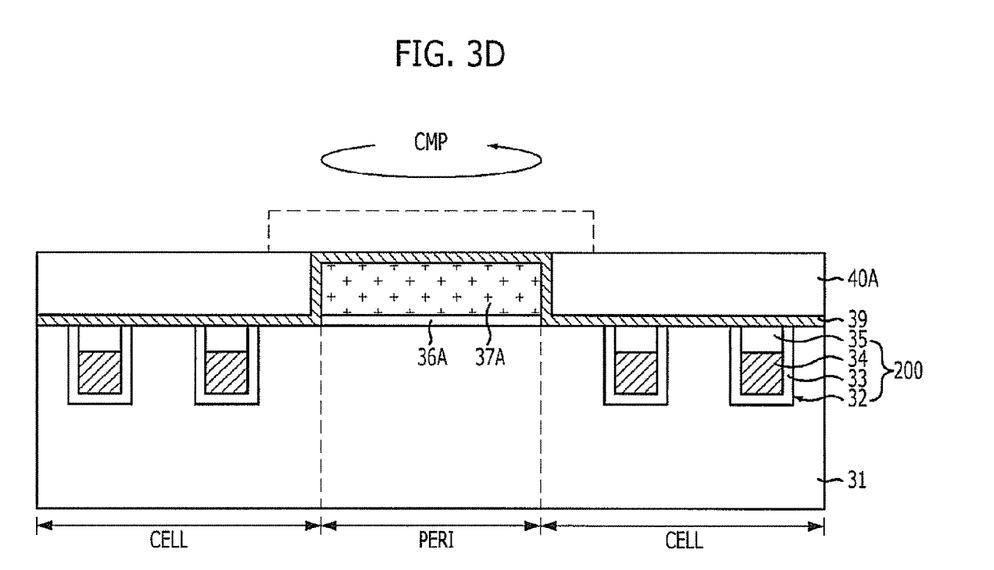

Referring to FIG. 3D, the insulation layer 40 is planarized to expose the sealing layer 39 over the peripheral gate conductive layer pattern 37A. The planarization process may be performed through a chemical mechanical polishing (CMP). Hereafter, the planarized insulation layer 40 is denoted with a reference numeral '40A' and referred to as "an insulation layer pattern 40A."

Through the processes described above, it is possible to prevent the formation of protrusions at the boundary between the cell regions and the peripheral regions in the course of forming a stacked layer of the sealing layer 39 and the insulation layer pattern 40A in the cell regions of the substrate 31 and forming a stacked layer of the peripheral gate insulation layer pattern 36A and the peripheral gate conductive layer pattern 37A in the peripheral regions of the substrate 31. Also, it is possible to protect the peripheral gate conductive layer pattern 37A from being damaged (or lost) during a process due to the sealing layer 39 formed along the surface of the resultant structure including the peripheral gate conductive layer pattern 37A.

Figure 3E:
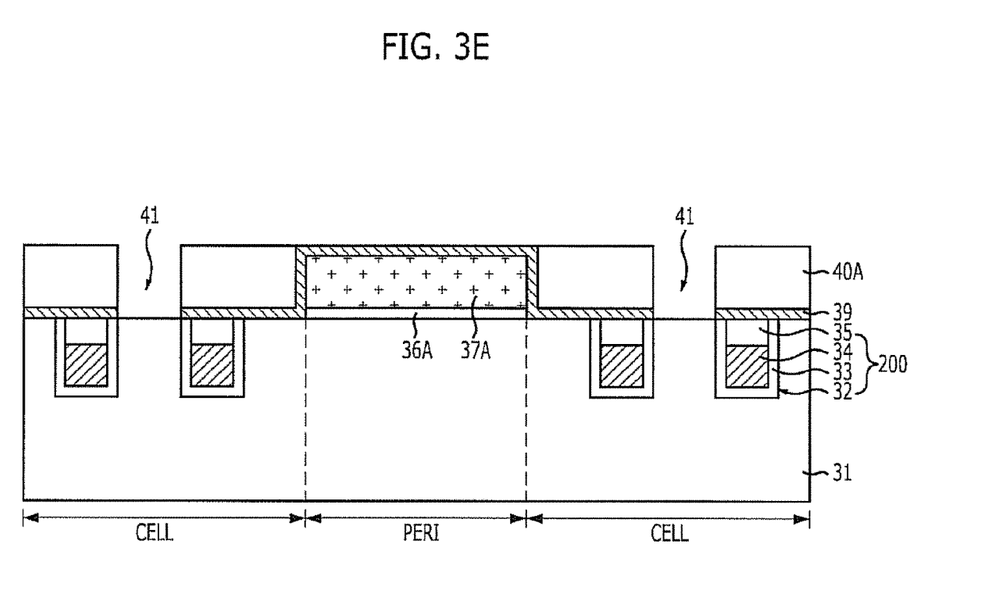

Referring to FIG. 3E, a plurality of contact holes 41 exposing the surface of the substrate 31 between the buried gates 200 are formed by selectively etching the insulation layer pattern 40A and the sealing layer 39 in the cell regions. Herein, only bit line contact holes for bit line contact plugs connected to bit lines may be formed, or storage node contact holes for storage node contact plugs which are connected to storage nodes while bit line contact holes are formed. Herein, when the contact holes 41 are formed, the bit line contact holes and the storage node contact holes may be formed simultaneously in order to alleviate the difficulty of performing a subsequent process for forming contact plugs.

Figure 3F:
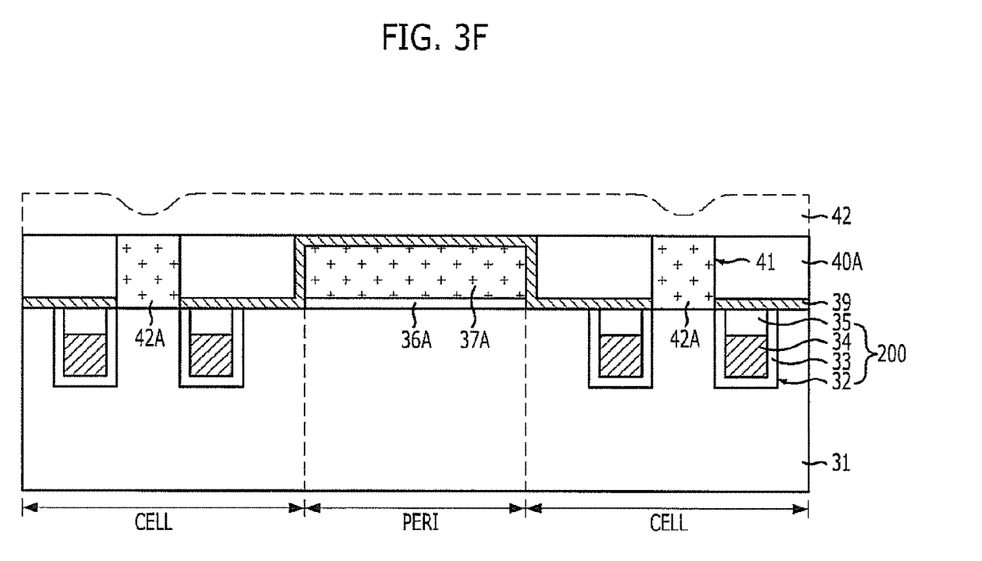

Referring to FIG. 3F, a plug conductive layer 42 is deposited over the substrate 31 to fill the contact holes 41. Herein, the plug conductive layer 42 may be formed of a conductive material having a selectivity with respect to the sealing layer 39. Therefore, the plug conductive layer 42 may be a single layer of a silicon layer or a metal layer or a stacked layer where a silicon layer and a metal layer are stacked.

Subsequently, a plurality of plugs 42A are formed by planarizing the plug conductive layer 42 to expose the upper surface of the insulation layer pattern 40A. The planarization process may be performed through a chemical mechanical polishing method or a blanket etch method. During the formation of the plurality of the plugs 42A, the sealing layer 39 protects the peripheral gate conductive layer pattern 37A from being damaged (or lost).

Herein, when only bit line contact holes are formed during the formation of the contact holes 41, the plugs 42A function as bit line contact plugs. When both bit line contact holes and storage node contact holes are formed during the formation of the contact holes 41, the plugs 42A function as bit line contact plugs and/or storage node contact plugs according to the positions where they are formed.

Figure 3G:
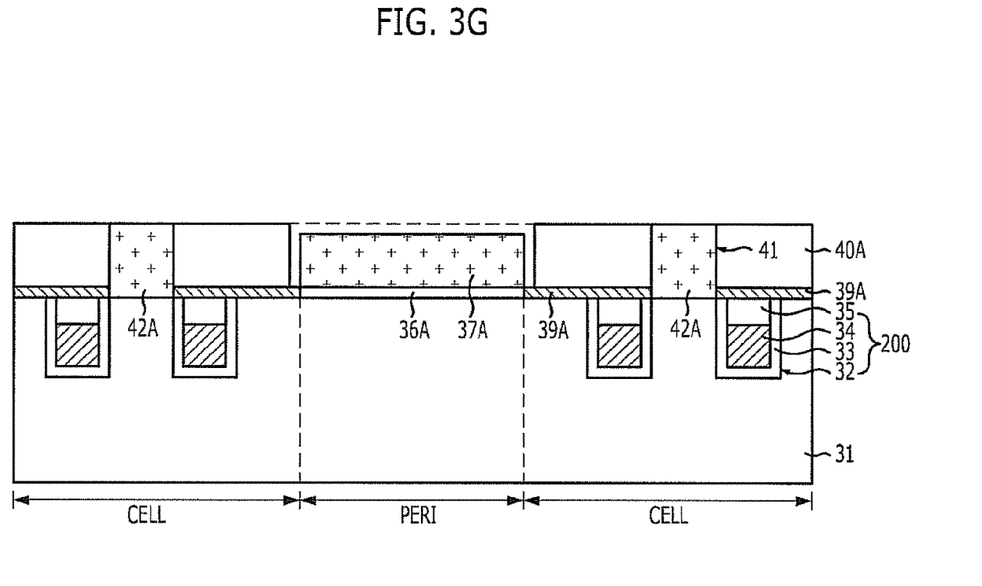

Referring to FIG. 3G, the upper surface of the peripheral gate conductive layer pattern 37A is exposed. For example, the sealing layer 39 remaining over the peripheral gate conductive layer pattern 37A is selectively removed. Herein, the sealing layer 39 remaining between the insulation layer pattern 40A and the peripheral gate conductive layer pattern 37A is removed other than the sealing layer 39 remaining over the upper surface of the peripheral gate conductive layer pattern 37A. Hereafter, the remaining sealing layer is denoted with a reference numeral '39A' and referred to as "a sealing layer pattern 39A."

The sealing layer pattern 39A may be removed through a wet etch process. This is to protect the peripheral gate conductive layer pattern 37A from being damaged (or lost) in the course of removing the sealing layer pattern 39A. For example, when the sealing layer pattern 39A is formed of a nitride layer, the sealing layer pattern 39A may be selectively removed through a wet etch process using a phosphoric acid solution. The sealing layer pattern 39 over the peripheral gate conductive layer pattern 37A may be removed through an over-polishing or over-etch process during the planarization process for forming the plugs 42A. However, when the sealing layer pattern 39A over the peripheral gate conductive layer pattern 37A is removed through the over-polishing or over-etch process, the peripheral gate conductive layer pattern 37A under the sealing layer pattern 39A may be damaged (or lost). When the peripheral gate conductive layer pattern 37A is damaged (or lost), an etch target may be altered during a subsequent patterning process for forming peripheral gates, and thus the substrate 31 may be damaged (or lost) or the characteristics of the peripheral gates may be deteriorated, which raises a concern.

While the conventional technology requires an etch process using a peripheral open mask to expose all the upper surface of the structures formed in the peripheral regions, the technology of the embodiment of the present invention can easily expose the upper surface of the structures formed in the peripheral regions without using a peripheral open mask. This simplifies the process and leads to an improvement in the productivity of a semiconductor device fabrication process.

Figure 3H:
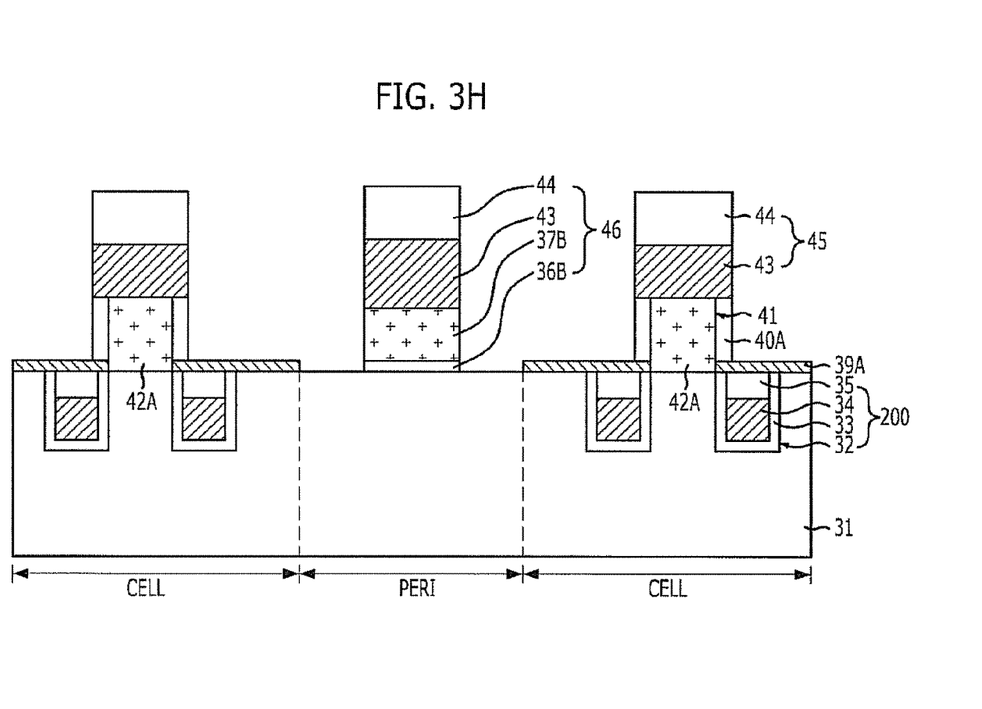

Referring to FIG. 3H, a conductive layer 43 and a hard mask layer 44 are sequentially deposited to form bit lines and peripheral gate electrodes over the substrate 31. The hard mask layer 44, the conductive layer 43, and the insulation layer pattern 40A in the cell regions are selectively etched to thereby form the bit lines 45 contacting the plugs 42A, that is, bit line contact plugs. Herein, the sealing layer pattern 39A and the protective layer 35 protect the buried gates 200 and the substrate 31 from being damaged during the process.

Meanwhile, in the first embodiment of the present invention, when the bit lines 45 are formed, the etch process is performed down to the insulation layer pattern 40A under the bit lines 45. However, if needed, the bit lines 45 may be formed by etching the hard mask layer 44 and the conductive layer 43 and leaving the insulation layer pattern 40A under the bit lines 45 intact.

Subsequently, peripheral gates 46 are formed by sequentially etching the hard mask layer 44, the conductive layer 43, the peripheral gate conductive layer pattern 37A, and the peripheral gate insulation layer pattern 36A in the peripheral regions. Hereafter, the etched peripheral gate conductive layer pattern 37A and the etched peripheral gate insulation layer pattern 36A are denoted with reference numerals '37B' and '36B' and referred to as "etched peripheral gate conductive layer pattern 37B" and "the etched peripheral gate insulation layer pattern 36B," respectively. Herein, the substrate 31 may be protected from being damaged (or lost) during the patterning process for forming the peripheral gates 46 by using the sealing layer pattern 39 to protect the etched peripheral gate conductive layer pattern 37B from being damaged (or lost) until the conductive layer 43 is formed.

In addition, the productivity of a semiconductor device fabrication process may be improved by using the cell open mask just once during the process and thereby simplifying procedural steps.

Figure 4A:
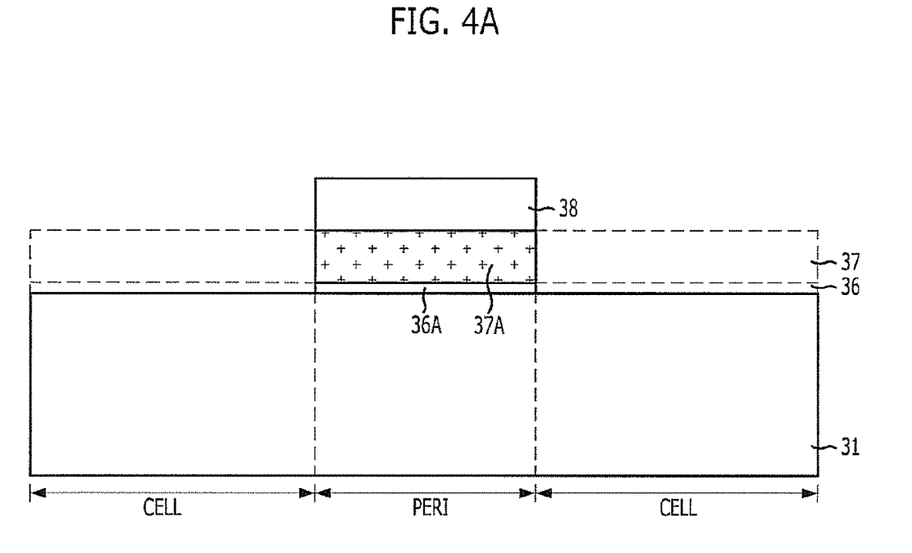
FIGS. 4A to 4C are cross-sectional views illustrating a method for fabricating a semiconductor device employing buried gates in accordance with a second embodiment of the present invention.
Figure 4B:
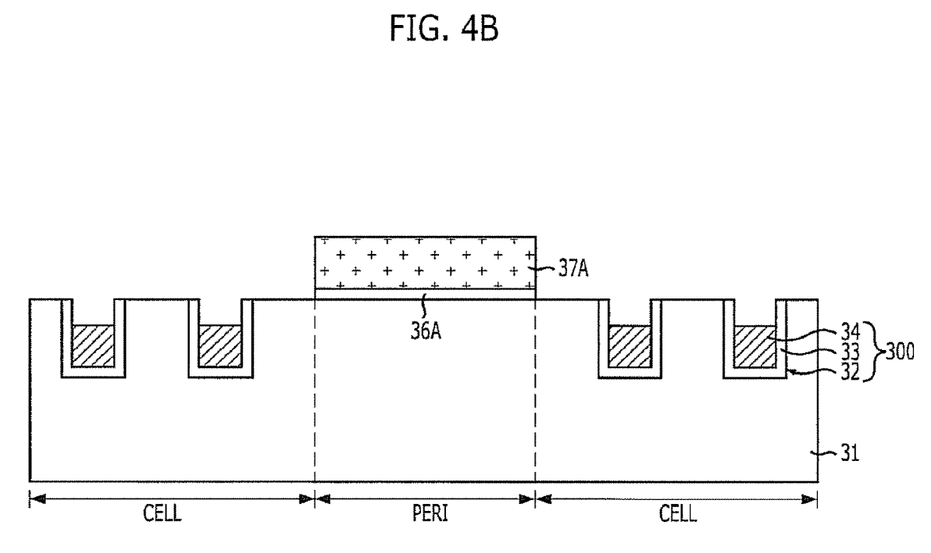
Figure 4C:
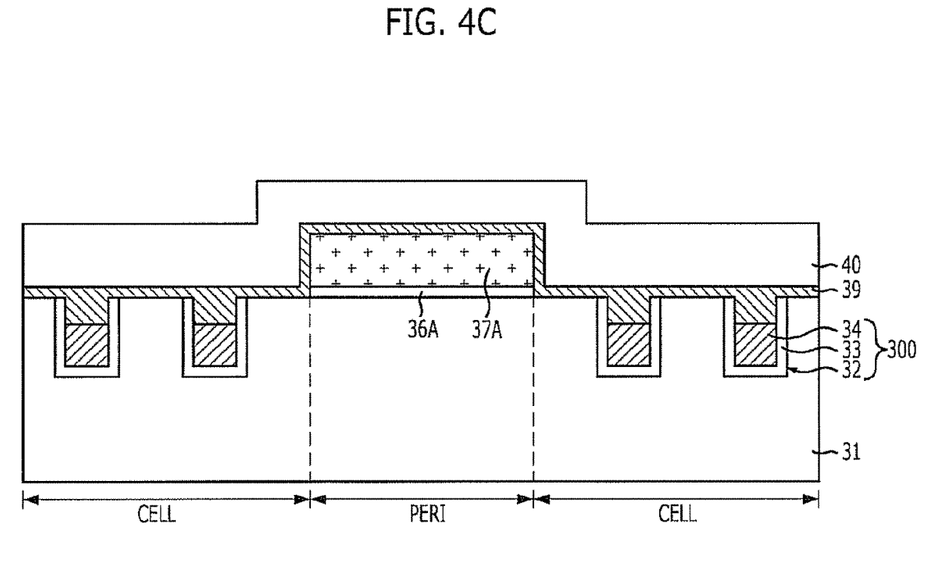

FIGS. 4A to 4C are cross-sectional views illustrating a method for fabricating a semiconductor device employing buried gates in accordance with a second embodiment of the present invention. For the sake of convenience in description, the same reference numerals are used for the same constituent elements as those of the semiconductor device illustrated in FIGS. 3A-3H.

Referring to FIG. 4A, a peripheral gate insulation layer 36 and a peripheral gate conductive layer 37 are sequentially formed over a substrate 31 having cell regions and peripheral regions, and then a photoresist pattern 38 is formed over the peripheral gate conductive layer 37 by using a cell open mask.

Herein, the cell regions defined by the cell open mask which leaves a peripheral gate insulation layer pattern 36A and a peripheral gate conductive layer pattern 37A only in the peripheral regions are predetermined. In other words, the linewidth of the photoresist pattern 38 is the same as the predetermined linewidth of a peripheral region. This is because the peripheral gate conductive layer pattern 37A is formed in the peripheral regions before a plug conductive layer is formed in the cell regions and thus there is no structure formed at the boundary between the cell regions and the peripheral regions before the formation of the photoresist pattern 38 (for examples, structures formed in prior art structures).

Therefore, the linewidth of the photoresist pattern 38 formed by using the cell open mask is the same as the predetermined linewidth of a peripheral region. Even if there is an error occurring in the middle of the formation of the photoresist pattern 38, for example, although misalignment occurs, it is possible to prevent a pre-formed structure (e.g., that may exist in prior art structures) from being damaged during a process of etching the peripheral gate conductive layer pattern 37A and the peripheral gate insulation layer pattern 36A. The linewidth of the photoresist pattern 38 may be controlled by adjusting the energy of exposed light and the distance between the cell open mask and a photoresist layer during the exposure process for forming the photoresist pattern 38 by using the cell open mask.

Subsequently, the peripheral gate conductive layer 37 and the peripheral gate insulation layer 36 are sequentially etched by using the photoresist pattern 38 as an etch barrier. Hereafter, the etched peripheral gate conductive layer 37 and the etched peripheral gate insulation layer 36 are denoted with reference numerals '37A' and '36A' and referred to as "a peripheral gate conductive layer pattern 37A" and "a peripheral gate insulation layer pattern 36A," respectively.

Referring to FIG. 4B, after the photoresist pattern 38 is removed, a hard mask pattern (not shown) is formed and is used to form buried gates 300 in the cell regions. Subsequently, the substrate 31 in the cell regions is etched by using the hard mask pattern as an etch barrier to thereby form a plurality of trenches 32.

Subsequently, a cell gate insulation layer 33 is formed on the surface of the trenches 32, and a cell gate electrode 34 filling a portion of each trench 32 is formed over the cell gate insulation layer 33. As a result, the buried gates 300 each including the trench 32, the cell gate insulation layer 33 and the cell gate electrode 34 are formed.

Referring to FIG. 4C, a sealing layer 39 is formed over the resultant structure including the peripheral gate conductive layer pattern 37A and fills the remaining portion of the trench 32. The sealing layer 39 protects the substrate 31 and the buried gates 300 in the cell regions during a subsequent process while protecting the peripheral gate conductive layer pattern 37A from being damaged (or lost). Therefore, the sealing layer 39 may be formed of a material having a selectivity (e.g., etch selectivity or polishing selectivity) with respect to the substrate 31 and the peripheral gate conductive layer pattern 37A. For example, the sealing layer 39 may be formed of a nitride layer.

Subsequently, an insulation layer 40 is formed over the sealing layer 39 to cover the resultant structure including the peripheral gate conductive layer pattern 37A. The insulation layer 40 may be formed of a material having a selectivity with respect to the sealing layer 39. For example, when the sealing layer 39 is formed of a nitride layer, the insulation layer 40 may be formed of an oxide layer.

Subsequent processes after the foregoing steps are the same processes described with respect to the first embodiment in reference to FIGS. 3D to 3H.

As described above, in the second embodiment of the present invention, the procedural steps of the semiconductor device fabrication process may be simplified even more as compared to those of the first embodiment by forming the buried gates 300 in the cell regions after the peripheral gate conductive layer pattern 37A is selectively formed over the substrate 31 in the peripheral regions and skipping the formation of a protective layer 35 in the first embodiment.

Also, the stability of the buried gates 300 may be improved by forming the buried gates 300 after the peripheral gate insulation layer pattern 36A is formed.

According to the embodiments of the present invention described above, the formation of protrusions at the boundary between cell regions and peripheral regions may be prevented by forming a gate conductive layer in the peripheral regions before the formation of plugs.

As a result, exemplary embodiments of the present invention can prevent deteriorations in the characteristics and reliability of a semiconductor device which may be caused as pre-formed structures are damaged (or lost) during the planarization process for removing the protrusions.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    providing a substrate including cell regions and peripheral regions;
    selectively forming a gate conductive layer over the substrate in the peripheral regions;
    forming a sealing layer over the substrate with the gate conductive layer formed thereon;
    forming an insulation layer over the sealing layer to cover the substrate with the gate conductive layer formed on the substrate;
    planarizing the insulation layer to expose the sealing layer formed over the gate conductive layer; and
    forming a plurality of plugs in the cell regions, the plurality of the plugs penetrating the insulation layer and the sealing layer.

2. The method of claim 1, further comprising:
    forming a plurality of buried gates in the cell regions before the selective forming of the gate conductive layer or forming a plurality of buried gates in the cell regions after the selective forming of the gate conductive layer.

3. The method of claim 2, wherein the forming of the plurality of the buried gates in the cell regions before the selective forming of the gate conductive layer includes:
    forming a plurality of trenches by selectively etching the substrate in the cell regions;
    forming a cell gate insulation layer over the plurality of the trenches;
    forming cell gate electrodes over the cell gate insulation layer, each cell gate electrode filling a portion of a respective trench; and
    forming a protective layer over the cell gate electrodes, the protective layer filling a remaining portion of each of the trenches.

4. The method of claim 2, wherein the forming of the plurality of the buried gates in the cell regions after the selective forming of the gate conductive layer includes:
    forming a plurality of trenches by selectively etching the substrate in the cell regions;
    forming a cell gate insulation layer over the plurality of the trenches;
    forming cell gate electrodes over the cell gate insulation layer, each cell gate electrode filling a portion of a respective trench; and
    forming a sealing layer over the substrate including the gate conductive layer to fill a remaining portion of each of the trenches.

5. The method of claim 1, wherein the selective forming of the gate conductive layer over the substrate in the peripheral regions includes:
    forming the gate conductive layer over the substrate; and
    etching the gate conductive layer by using a cell open mask.

6. The method of claim 1, wherein the insulation layer is planarized through a chemical mechanical polishing (CMP) process.

7. The method of claim 1, wherein the forming of the plurality of the plugs includes:
    forming a plurality of contact holes exposing a surface of the substrate by selectively etching the insulation layer and the sealing layer;
    depositing a plug conductive layer over the substrate to fill the contact holes; and
    planarizing the plug conductive layer to expose an upper surface of the insulation layer.

8. The method of claim 7, wherein the plug conductive layer is planarized through a chemical mechanical polishing process or a blanket etch process.

9. A method for fabricating a semiconductor device, comprising:
    providing a substrate including cell regions and peripheral regions;
    forming a gate conductive layer over the substrate;
    etching the gate conductive layer by using a cell open mask;
    forming a sealing layer over the substrate with the gate conductive layer formed thereon;
    forming an insulation layer over the sealing layer to cover the substrate with the gate conductive layer formed on the substrate;
    planarizing the insulation layer to expose the sealing layer formed over the gate conductive layer;
    forming a plurality of plugs in the cell regions, the plurality of the plugs penetrating the insulation layer and the sealing layer;
    selectively removing the sealing layer formed over the gate conductive layer; and
    forming peripheral gates by patterning the gate conductive layer.

10. The method of claim 9, further comprising:
    forming a plurality of buried gates in the cell regions before the selective forming of the gate conductive layer or forming a plurality of buried gates in the cell regions after the selective forming of the gate conductive layer.

11. The method of claim 10, wherein the forming of the plurality of the buried gates in the cell regions before the selective forming of the gate conductive layer includes:
    forming a plurality of trenches by selectively etching the substrate in the cell regions;
    forming a cell gate insulation layer over the plurality of the trenches;
    forming cell gate electrodes over the cell gate insulation layer, each cell gate electrode filling a portion of a respective trench; and
    forming a protective layer over the cell gate electrodes, the protective layer filling a remaining portion of each of the trenches.

12. The method of claim 10, wherein the forming of the plurality of the buried gates in the cell regions after the selective forming of the gate conductive layer includes:

forming a plurality of trenches by selectively etching the substrate in the cell regions;

forming a cell gate insulation layer over the plurality of the trenches;

forming cell gate electrodes over the cell gate insulation layer, each cell gate electrode filling a portion of a respective trench; and forming a sealing layer over the substrate including the gate conductive layer to fill a remaining portion of each of the trenches.

13. The method of claim 9, wherein the etching of the gate conductive layer by using the cell open mask includes:

forming a photoresist layer pattern over the gate conductive layer by using the cell open mask, the photoresist pattern having the same linewidth as a predetermined linewidth of the peripheral regions; and etching the gate conductive layer by using the photoresist layer pattern as an etch barrier.

14. The method of claim 9, wherein the insulation layer is planarized through a chemical mechanical polishing (CMP) process.

15. The method of claim 14, wherein the sealing layer is formed of a material having a selectivity with respect to the insulation layer.

16. The method of claim 15, wherein the sealing layer includes a nitride layer, and the insulation layer includes an oxide layer.

17. The method of claim 9, wherein the forming of the plurality of the plugs includes:

forming a plurality of contact holes exposing a surface of the substrate by selectively etching the insulation layer and the sealing layer;

depositing a plug conductive layer over the substrate to fill the contact holes; and planarizing the plug conductive layer to expose an upper surface of the insulation layer.

18. The method of claim 17, wherein the plug conductive layer is planarized through a chemical mechanical polishing process or a blanket etch process.

19. The method of claim 18, wherein the plug conductive layer is formed of a material having a selectivity with respect to the sealing layer.

20. The method of claim 19, wherein the sealing layer includes a nitride layer, and the plug conductive layer includes a single layer of a silicon layer or a metal layer, or a stacked layer where a silicon layer and a metal layer are stacked.

21. The method of claim 9, wherein the sealing layer is selectively removed through a wet etch process.

22. The method of claim 21, wherein the gate conductive layer is formed of a material having a selectivity with respect to the sealing layer.

23. The method of claim 22, wherein the sealing layer includes a nitride layer, and the gate conductive layer includes a polysilicon layer.

* * * * *